United States Patent [19]

Dooley et al.

[11] Patent Number: 4,870,343
[45] Date of Patent: Sep. 26, 1989

[54] HIGH VOLTAGE DETECTOR

[75] Inventors: Mark W. Dooley, Stanhope; Robert B. Dayke, Long Valley, both of N.J.

[73] Assignee: Public Service Electric & Gas Co., Newark, N.J.

[21] Appl. No.: 224,318

[22] Filed: Jul. 26, 1988

[51] Int. Cl.$^4$ .................................... G01R 31/02
[52] U.S. Cl. .................................... 324/725; 324/122; 324/133; 324/556
[58] Field of Search .................. 324/72.5, 133, 122, 324/555, 556; 340/660, 664, 662; 361/91, 111

[56] References Cited

U.S. PATENT DOCUMENTS

| | | | |
|---|---|---|---|
| 1,906,644 | 5/1933 | Sleeper | 324/122 |
| 3,416,074 | 12/1968 | Schoonover | 324/72.5 |
| 3,826,981 | 7/1974 | Ross | 324/72.5 |
| 4,152,639 | 5/1979 | Chaffee | 324/72.5 X |
| 4,503,389 | 3/1985 | Singer | 324/72.5 X |
| 4,503,390 | 3/1985 | Wells, Jr. | 324/133 |
| 4,634,971 | 1/1987 | Johnson et al. | 324/72.5 X |
| 4,642,559 | 2/1987 | Slough | 324/72.5 X |

Primary Examiner—Reinhard J. Eisenzopf
Assistant Examiner—Robert W. Mueller

[57] ABSTRACT

A high voltage detecting device has an input terminal for receiving electrical energy and includes a first circuit having a gas filled tube receiving electrical energy from the terminal. The gas filled tube provides a visual indication of the presence of high voltage. A second circuit also receives electrical energy from the terminal and is coupled in parallel with the first circuit. The second circuit provides an audible and visual indication of the presence of high voltage. The high voltage detecting device is contained in a test stick having a housing. The housing includes three compartments for holding the first and second circuits along with a power supply for the second circuit. The two independent circuits in the test stick provide a positive indication of the presence of high voltage over a broad range of transmission and distribution applications.

27 Claims, 2 Drawing Sheets

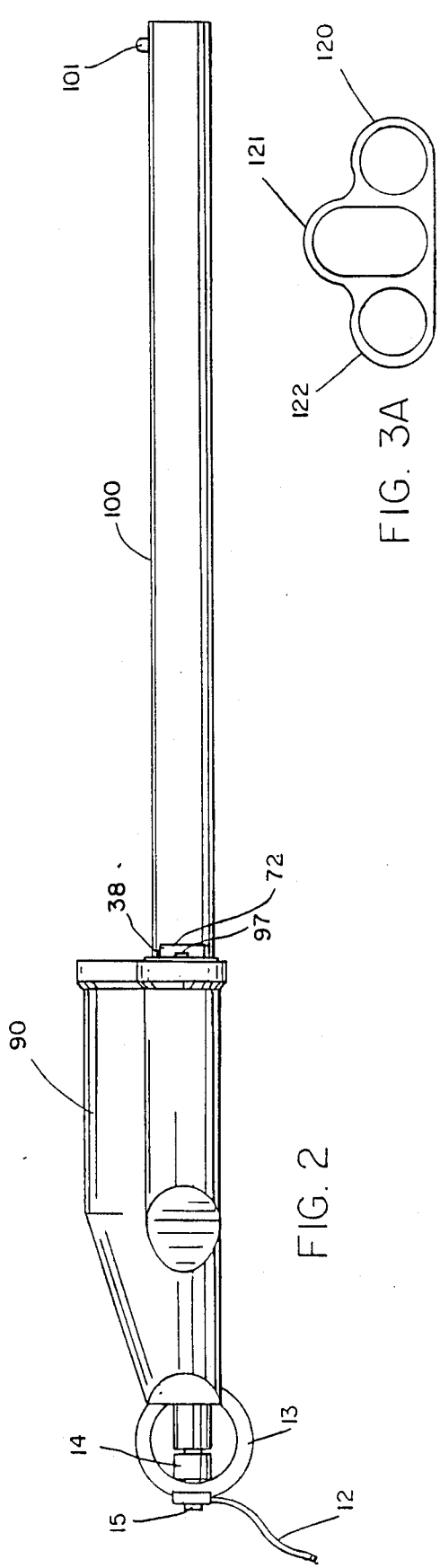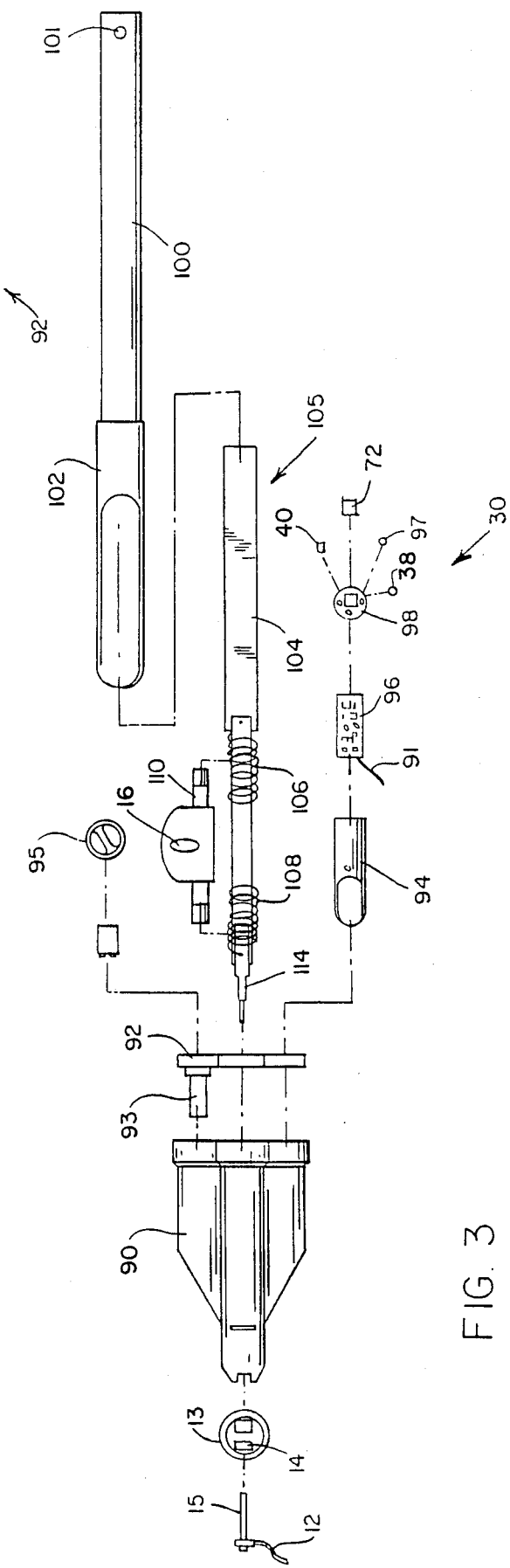
FIG. 2
FIG. 3A
FIG. 3

HIGH VOLTAGE DETECTOR

FIELD OF THE INVENTION

This invention relates to a means for detecting the presence of electrical energy and, more particularly, to a high voltage detecting test stick. The high voltage test stick produces both a visual and an audible signal in response to a broad range of transmission and distribution voltages.

BACKGROUND OF THE INVENTION

It is well known for utility company servicemen to use high voltage detecting test sticks when in the field. Prior art test sticks have employed a neon filled gas tube which glows in the presence of high voltage over a predetermined value. The predetermined value is usually dependent upon the characteristics of the neon tube.

Typically, a terminal prong of the test stick is applied to or near a piece of energized electrical equipment. The potential difference between the equipment and ground causes a small current to flow through the terminal prong via a conductor to an electrode of the neon tube. If the potential and the frequency of the voltage alternations from the electrical energy applied to the electrode are of a suitable value, the tube will glow thereby detecting the presence of such energy. The field serviceman detects the visible glow of the neon tube indicating the high potential. An electrical test stick of the type described above is known from U.S. Pat. No. 1,906,644.

A problem associated with the neon tube test stick is that when used in the field, often times the glow of the tube is hard to detect due to the bright sunlight. U.S. Pat. No. 1,906,644 makes use of a sun shield formed from an insulating material which is secured around the neon tube. However, depending upon the angle at which the test stick is held, the sun shield still may not provide enough cover for the illumination to be detected by the field serviceman.

Another known device is the current sensing monitor described in U.S. Pat. No. 4,558,310 which discloses the use of both visible and audible indicators. However, the current sensing device is not designed to function as a potential indicator for the industrial applications of large public utility companies which detect very high voltage situations. Another low voltage detecting device, U.S. Pat. No. 2,586,806, discloses the use of an auxiliary voltage responsive device wired in parallel with the testing device and providing simultaneous indications of the presence of electrical potential. Again, the potential indicator is manufactured and calibrated for a low voltage range and is not suitable for high voltage applications.

SUMMARY OF THE INVENTION

The present invention overcomes these problems by providing a new and improved high voltage detector using a new electronic circuit and having three indicators for the presence of high voltage. The detector houses two independent high voltage detecting circuits. The first circuit is a neon gas filled tube circuit which is self-powered and capacitively coupled to the conductor to be tested. The neon tube glows whenever a discharge occurs between its electrodes thus signalling a high voltage. Coupled in parallel with the neon circuit is an electronic circuit operating off an independent power supply, i.e. a nine volt battery. The electronic circuit provides both a visible signal using a flashing light emitting diode (LED) indicator and a pulsing audible signal. The use of three separate indicating devices overcomes the problems that field servicemen encountered when using prior art test sticks.

Additionally, the detector housing is formed of a dark, black material so that the neon tube in the neon circuit is visible to the field servicemen. A high gloss black finish is used on the internal surfaces and a flat black surface is used on the outside surfaces to optimize performance.

It is an additional advantage to use a super bright, red LED for the positive indication of high voltage under adverse viewing conditions. The use of the flashing super bright LED in the electronic circuit allows the field serviceman to detect the presence of high voltage when viewing the test stick during bright sunlight or from a distance.

Further, it is advantageous to couple an audible signal in parallel with the super bright LED in the electronic circuit. A pulsing audible signal indicating the presence of high voltage can easily be heard by the field serviceman. Also, the use of both an LED visual signal and an audible signal functions as a low battery indicator during a self-test mode of operation for the electronic circuit. As the battery loses power, the signals no longer pulsate but remain constant.

It is yet another advantage of the invention to place the electronic circuit on a replaceable electronic module. The electronic module can easily and quickly be inserted into the detector housing.

Further, it is yet another advantage to provide a high voltage detector test stick which operates over a wide range of transmission and distribution voltages. A two position switch is included to change the operating range of the test stick.

It is still yet another advantage to provide a electronic circuit which is designed for low power consumption. The use of the new low power electronic circuit extends the power supply battery life.

It is particularly advantageous to provide a high voltage test stick having a reinforced fiberglass construction. The sight chamber of the housing enhances the visibility of the neon tube. The entire test stick is designed to be moisture resistant for use in all weather conditions.

Further, it is advantageous to provide the test stick with a light weight fiberglass handle having a universal push button connector. The push button connector allows the test stick to be compatible with other test sticks and extensions.

These and other advantages will be realized by the device of the present invention as explained in detail below.

DESCRIPTION OF THE FIGURES

FIG. 2 is a side view of a test stick made according to the invention.

FIG. 3 is an extended view of the test stick in an unassembled condition.

FIG. 3A is an end view of the end cap of FIG. 2.

DETAILED DESCRIPTION

Figure 1:
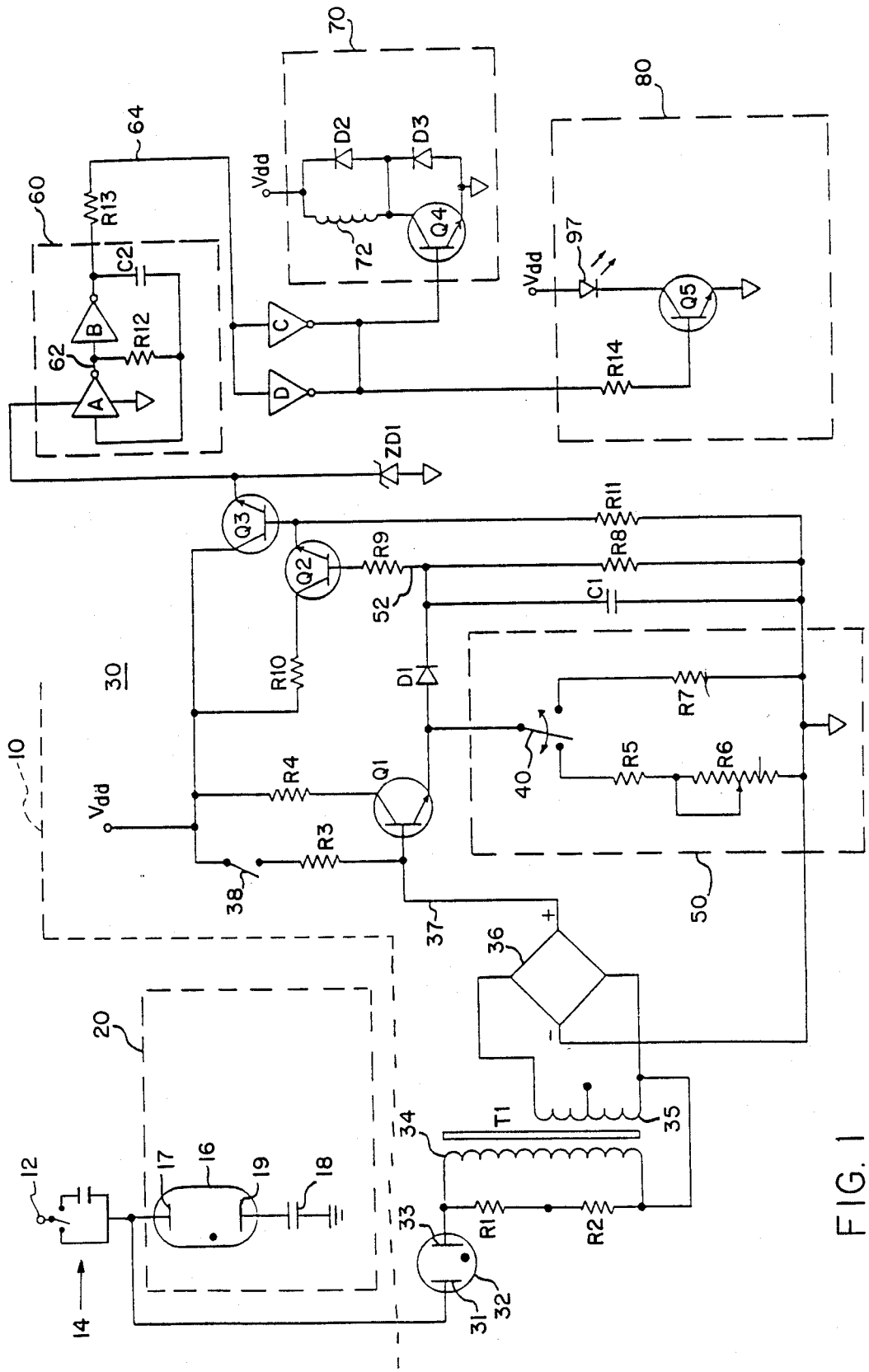
FIG. 1 is a circuit diagram of a preferred embodiment of the invention.

FIG. 1 shows a schematic diagram of the two independent high voltage detecting circuits. Dashed line 10 separates the neon gas filled circuit 20 from the electronic circuit 30. The neon circuit 20 and the electronic circuit 30 are electrically coupled in parallel with each other.

The neon gas filled tube circuit 20 is of the conventional high voltage test stick type. The neon circuit has a gas filled tube 16 having one of its electrodes 19 coupled in serial with a capacitor 18 to ground. The other electrode 17 of tube 16 is coupled in series with a spark gap 14 being selectively opened or closed depending upon the mode of operation. The spark gap is coupled to the source of the high voltage which enters the circuit through terminal prong 12.

In operation of the neon circuit, the terminal prong 12 is applied to or near a piece of energized electrical equipment. The electrical energy from the equipment flows through the terminal prong 12 and the spark gap 14 to the electrode 17 of the tube 16. Spark gap 14 is a mechanical spark gap, which can be opened or closed, and is used to boost the energy level delivered to the detecting unit under high voltage applications i.e. greater than 10 Kv. The fully opened spark gap, which acts as a capacitor, is required to overcome the effect of the radiated fields encountered at the high voltage levels.

The electrical energy or charging current flows into the condenser, causing the gas in the loop of the neon tube 16 to glow. The detecting range of the neon circuit depends primarily upon the characterics of the neon tube 16. It has been found advantageous for a self-powered test device to use a neon tube circuit which is suitable for tests on lines and equipment operating in the range from 2300 volts to 220 Kv.

The electronic circuit 30 operating in parallel with the neon circuit 20 receives its input through the same terminal prong 12 and spark gap 14 as the neon circuit 20. The electronic circuit 30 includes a miniature neon bulb 32 having an electrode 31 which receives the electrical energy from the terminal prong 12. The other electrode 33 is electrically coupled through series resistors R1 and R2 which are in parallel with the primary winding of transformer T1. Resistors R1 and R2 function as shunt resistors. The combination of the miniature neon bulb 32 and the shunt resistors R1 and R2 sets the sensitivity of the alarm such that the circuit is not triggered by voltages below a predetermined level.

As an example, using values for resistors R1 and R2 of 15 M$\Omega$ and 10 M$\Omega$, respectively, the detecting circuit can be set to trigger upon the detection of a voltage greater than 0.2 Kvac.

The secondary winding 35 from transformer T1 is coupled across a bridge rectifier 36. Further, the transformer T1 having a feedback path from the secondary 35 to the primary winding 34 functions as an internal ground establishing circuit so that high current is not drawn to the operator of the test stick. The positive output pulses of the bridge rectifier 36 are connected to the base of a transistor Q1 through a conductor wire 37. The collector of the transistor Q1 is connected to a supply voltage $V_{dd}$, i.e. a nine volt battery, through a resister R4. The emitter of the transistor Q1 is connected through a diode D1, and the output signal is filtered by a capacitor C1. The emitter of the transistor Q1 is also connected through a range switch assembly, indicated generally by the dashed line 50, to a negative terminal of the power supply, i.e. ground.

The range switch assembly 50 includes a switch 40 which alternately directs current to ground through a resistor R7 or through a pair of serially connected resistors R5 and R6. The resistor R6 can be a variable resistor used for adjusting the high range setting.

A resistor R8 is connected in parallel across capacitor C1. Resistor R8 functions as a bleeder resistor to drain energy from the filter capacitor C1. The filtered output from the emitter of the transistor Q1 through the diode D1 is input to the base of a transistor Q2 through a resistor R9. The supply voltage, $V_{dd}$, is connected through a resistor R10 to the collector of the transistor Q2. The supply voltage is also connected to the collector of a transistor Q3 having a base receiving the output from the emitter of transistor Q2. The emitter of the transistor Q2 is coupled to ground through a resistor R11.

The output from the emitter of transistor Q3 is input to the oscillating circuit, indicated by dashed line 60, to turn on the oscillating circuit 60. The oscillating circuit 60 is also coupled to ground through a zener diode ZD1 used to protect the integrated circuit. The oscillator 60 includes an inverter A coupled along conductor wire 62 to a second inventer B. A resistor R12 has one end coupled to the conductor wire 62 between the two inverters A and B. The other end of the resistor R12 is coupled to both the input of inverter A and to a capacitor C2. The opposite end of the capacitor C2 is coupled to the output of the inverter B. Resister R12 and capacitor C2 function to set the frequency of the oscillator 60.

The output from the oscillating circuit 60 passes through a resistor R13 on conductor wire 64 and is coupled to a pair of parallel buffers C and D. The output from the parallel buffers is used to drive an audible circuit 70 and a visual circuit 80.

The audible circuit 70 has a transistor Q4 receiving an input from the parallel buffers C and D. An audible indicator 72 such as a piezoelectric buzzer is coupled serially between the supply voltage $V_{dd}$ and the collector of transistor Q4. A diode D2 is coupled in parallel across the audible indicator 72. Further, another diode D3 is coupled across the collector-emitter junction of transistor Q4.

The visual circuit 80 has a transistor Q5 receiving an input through a resistor R14 from the parallel buffers C and D. An LED is coupled serially between the power supply $V_{dd}$ and a collector of the transistor Q5.

In operation of the electronic circuit of FIG. 2, the electrical energy to be detected enters the miniature neon bulb 32 through the terminal prong 12 and the spark gap 14. The combination of the shunt resistors R1 and R2, along with the characteristics of the neon bulb, sets the sensitivity of the alarm so that the circuit will not be triggered by voltages below a predetermined value. Any energy detected above the predetermined value enters the primary winding 34 of the transformer T1. The transformer T1 reduces the signal to a lower level at a secondary winding 35.

The signal from the output of the secondary winding 35 is then applied across the bridge rectifier 36. The positive pulses produced by the bridge rectifier 36 drive the buffer amplifier Q1. The output of the buffer amplifier Q1 is filtered through capacitor C1. The switch 40 and the resistors R5, R6 and R7 form the range switch assembly 50 which serves to shunt current from the emitter of the buffer amplifier Q1 to the circuit ground for the determination of a high or low range setting.

As an example, the switch 40 can select a first path through resistor R5 having a value of 650 KΩ and the variable resistor R6, i.e., a 20 KΩ POT (10T). The other current shunting path may use a value of 560 KΩ for resistor R7. These typical values set the low setting for the range switch assembly to operate from 500 vac to 10 Kv. The high setting ranges from 10 Kv to 13 Kv. However, the operation of the test stick can be used up to 500 Kv depending upon the electrical component parameters.

Diode D1 prevents the filtering capacitor C1 from discharging back through the range switch assembly. Therefore, what essentially appears at the base of transistor Q2 is a DC voltage which is proportional to the detected input signal level.

The pair of transistors Q2 and Q3 are both buffer/amplifiers which provide enough current to turn on the oscillating circuit 60. The resistor R12 and capacitor C2 of the oscillating circuit 60 set the frequency of the oscillator. The oscillating signal is then fed through a pair of inverters C and D which are wired as parallel buffers. The pair of parallel buffers C and D simultaneously drive transistors Q4 and Q5 which are part of the audible and visual circuits, respectively.

Transistor Q4 allows the oscillator to switch a piezoelectric buzzer 72 on and off in order to produce a pulsed, audible tone. At the same time, transistor Q5 allows the oscillator to switch a super-bright LED on and off to produce a visible signal.

In an additional embodiment, a test switch is included in the circuit of FIG. 1 to check the proper functioning of the electronics and power supply. As seen from FIG. 1, the test circuit includes a momentary switch 38 coupled serially between the supply voltage $V_{dd}$ and one end of a resistor R3. The resistor R3 has its other end connected to the base of transistor Q1.

Under normal operating conditions, the test switch 38 is left in the open position so that the only input to transistor Q1 comes from the bridge rectifier 36 on conductor wire 37. However, in order to test the functioning of the electronics of FIG. 1, the test switch is closed allowing current from the power supply battery to flow through the resistor R3 into the base of transistor Q1. The current provided to the base of transistor Q1 turns on the alarm.

The use of both a neon circuit and an electronic circuit having a dual indicator provides the high voltage test stick with three different indications for the presence of high voltage. It is advantageous for the electronic circuit to use a super-bright, red LED for a positive indication of high voltage. A super-bright LED allows viewing under adverse conditions such as bright sunlight or from a distance.

The elements of the circuit shown in FIG. 1, and any variations thereof may be built into a test stick such as that shown in FIGS. 2 and 3. The test stick shown in FIG. 2 is a completely self-contained and portable unit which may be used anywhere.

FIG. 2 is a side view of an assembled high voltage test stick. The test stick includes an elongated handle member 100 having a universal push button connector 101 at one end. Located at the opposite end of the handle 100 is a housing 90 which contains the dual detecting circuits. An audible buzzer 72, a super-bright LED 97, a test switch 38 and a range switch 40 (not shown) are mounted at one end of the housing near the handle 100 and are coupled to the electronic circuit located inside the housing 90. At the opposite end of the housing 90 is the terminal prong 12 which is connected to a bolt 15 secured by the conducting ring 13 and the spark gap 14. The other end of the spark gap is electrically coupled to the dual detecting circuits located inside the housing 90.

FIG. 3 shows a high voltage test stick of the present invention in an unassembled condition. An open ended sheath 102 is attached to a handle member 100 at an end opposite from a universal push button connector 101. The neon gas filled tube circuit, designated generally by 105, includes an elongated copper member 104 having attached at one end a coil spring system 106 and 108 forming a tube socket. A condenser/neon tube 16 is inserted into the coil spring arrangement 106 and 108. Electrically coupled to the coil spring 108 is a conducting bolt 114 which extends through the housing and a bore in the conductor ring 13. The conducting bolt 114 is electrically connected to one end of the spark gap capacitor 14.

The terminal prong 12 has a bore at one end through which a conducting bolt 15 is inserted. The conducting bolt 15 extends through a bore in the conducting ring 13 and is fastened into the other end of the spark gap 14 away from the housing 90.

The electronic circuit, designated generally as 30, includes an electronic module 96. The module slides into a sheath 94 and is held in place by the cap 98. An audible buzzer 72, a range switch 40, a momentary test switch 38 and a super-bright LED 97 are attached to the cap 98 and are coupled to the electronic circuit through the cap 98 such that they are visible to the user. When the sheath 94 is assembled, it slides into a housing end cap 92.

The housing end cap 92, as shown in FIG. 3A, contains three compartments 120, 121, and 122. In the preferred embodiment, the sheathing for the electronic module is inserted into compartment 122 of the housing end cap 92.

The fully assembled handle member 100, including the condenser/neon bulb 16, is inserted into the main housing end cap compartment 121.

Integrally molded with the housing end cap 92 is a battery compartment 93 extending from the power supply compartment 120. A power supply cap 95 is associated with the compartment 120 to hold the battery. The battery is electrically coupled to the electronic circuit which is further coupled in parallel with the neon circuit.

The assembled end cap housing 92 slides into and is secured to the housing 90. The conductor bolt 114 extends through the housing 90 and is coupled to the terminal prong 12 through the spark gap 14 as described above.

It is readily apparent that the high voltage test stick of the present invention can be easily assembled and disassembled. Further, due to the compartmental nature of the housing end cap 92, either the battery in the battery compartment 120 or the electronic module in the module compartment 122 can be easily replaced.

Further, the use of a black, high gloss finish on the interior of the housing 90 allows the neon tube 112, which is inserted into end cap compartment 121, to be readily visible. A flat exterior finish further optimizes the indicator visibility by not reflecting any exterior lighting such as sunlight. Also, locating the detection circuitry at the distant end of the handle member away from the field serviceman minimizes electrical hazards to the operator. Use of a fiberglass construction produces a non-conducting and versatile high voltage detecting stick which is durable when used in the field.

What is claimed is:

1. A very high voltage detecting device having an input terminal having a single wire for receiving electrical energy, comprising:

(a) a first circuit having a first gas filled tube receiving electrical energy from the terminal, said first gas filled tube providing a visual indication of the presence of high voltage; and (b) a second circuit receiving electrical energy from the terminal coupled in parallel with said first circuit and having an internal ground establishing circuit, said second circuit providing an audible and visual indication of the presence of high voltage and having a power supply to operate independently of said first circuit.

2. A very high voltage detecting device according to claim 1 wherein said internal ground establishing circuit includes a means for reducing a high voltage signal to a lower signal level for use in said second circuit while establishing a ground for the high voltage in said second circuit.

3. A very high voltage detecting device according to claim 2 wherein said second circuit further comprises:

(a) means for receiving the high voltage signal operable to set the sensitivity of the second circuit and to deliver the high voltage signal to said reducing means;

(b) means for producing a pulsed signal from the lower signal level of the reducing means;

(c) a transistor receiving said pulsed lower signal level and providing a buffered output signal; and (d) a range switch assembly for shunting the buffered output signal from said transistor to a ground for determining an operating voltage range for said second circuit; and (e) a signal indicating circuit receiving the buffered output signal and providing the indication of the presence of high voltage.

4. A device according to claim 3 wherein said signal indicating circuit, further comprises:

(a) means for filtering said buffered output signal from the transistor and for preventing a discharge back through said range switch assembly;

(b) a current amplifying circuit receiving a filtered signal from said transistor and providing a buffered output signal;

(c) means for providing an oscillating signal output driven by said current amplifying circuit; and (d) means for driving a first and a second transistor coupled to the oscillating means and for producing an audible and a visual signal alternatingly switched on and off by said first and second transistors respectively.

5. A device for detecting high voltage according to claim 4 wherein said means for receiving a high voltage signal further comprises:

(a) a neon gas filled tube having a first electrode receive the high voltage signal; and (b) at least two serially coupled resistors electrically coupled at one end to a second electrode of said neon gas filled tube to shunt the high voltage signal and set the sensitivity of the device.

6. A device for detecting high voltage according to claim 5 wherein the sensitivity of the device is set to trigger at 200 Vac.

7. A device for detecting high voltage according to claim 5 wherein said means for reducing the high voltage signal is a transformer having a primary winding coupled in parallel across said serially coupled resistors and a secondary winding coupled to said means for producing a pulsed signal, said transformer further having a feedback path from the secondary winding to the primary winding to establish a high voltage circuit ground.

8. A device for detecting high voltage according to claim 7 wherein said means for producing a pulsed signal is a bridge rectifier.

9. A device for detecting high voltage according to claim 8 wherein said range switch assembly further comprises:

a switch coupled to the buffered output signal of said transistor to alternatively shunt the buffered output signal to ground through a first and second resistive path to operate the second circuit in a high or a low voltage range.

10. A device for detecting high voltage according to claim 9 wherein the low voltage range is 200 Vac to 3 kVac and the high voltage range is greater than 3 kVac.

11. A device for detecting high voltage according to claim 9 wherein said gating circuit further comprises:

(a) a third transistor having a collector, a base and an emitter receiving the filtered signal from said filtering means through a resistor; and (b) a fourth transistor receiving an output from the emitter of said third transistor and providing said gate output signal to the oscillating means.

12. A device for detecting high voltage according to claim 11 wherein said means for providing an oscillating signal further comprises:

(a) a first and a second inverter coupled to each other, said first inverter receiving power from the gated output signal to turn on the oscillating means;

(b) a capacitor coupled from the output of the second inverter to said first inverter; and (c) a resistor having one end coupled to a junction between said first and second inverters and the other end coupled to said capacitor whereby the capacitor and the resistor set the frequency of the oscillating means.

13. A device for detecting high voltage according to claim 12 wherein said means for producing a visual signal is a super-bright light emitting diode.

14. A device for detecting high voltage according to claim 13 wherein said means for producing an audible signal is a piezoelectric buzzer.

15. A device for detecting high voltage according to claim 14 further comprising a means for indicating a low power supply.

16. A very high voltage detecting device having an input terminal having a single wire for receiving electrical energy, comprising:

(a) a first circuit having a first gas filled tube for receiving electrical energy, said first gas filled tube providing a visual indication of the presence of high voltage;

(b) a second circuit receiving electrical energy coupled in parallel with said first circuit and having an internal ground establishing circuit, said second circuit providing an audible and visual indication of the presence of high voltage, said second circuit having a power supply to operate independently of said first circuit;

(c) a test circuit electrically coupled to said second circuit to test the operation of said second circuit.

17. A high voltage detecting device according to claim 16 wherein said second circuit further comprises:
  (a) means for receiving a high voltage signal operable to set the sensitivity of the second circuit;
  (b) means for reducing the high voltage signal from said receiving means to a lower signal level for use in said second circuit while establishing a ground for the high voltage in said second circuit;
  (c) means for producing a pulsed signal from the lower signal level of the reducing means;
  (d) a transistor receiving said lower signal level and providing a buffered output signal;
  (e) a range switch assembly for shunting the buffered output signal from said transistor to a ground for determining an operating voltage range for said second circuit;
  (f) means for filtering said buffered output signal from the transistor and for preventing a discharge back through said range switch assembly;
  (g) a gating circuit receiving a filtered signal from said transistor and providing a gated output signal;
  (h) means for providing an oscillating signal output driven by said gating circuit; and
  (i) means for driving a first and a second transistor coupled to the oscillating means and for producing an audible and a visual signal alternatingly switched on and off by said first and second transistors respectively.

18. A high voltage detecting device according to claim 17 wherein said test circuit further comprises:
  a momentary switch having one end coupled to the power supply and the other end coupled to said transistor through a resistor whereby closing the momentary switch allows current to flow through the resistor into the transistor to activate the second circuit.

19. A high voltage detecting device according to claim 18 wherein said test circuit further tests the condition of said power supply.

20. A test stick for detecting high voltage, comprising:
  (a) a housing;
  (b) a neon high voltage detecting circuit having a gas filled neon indicating tube located inside of said housing;
  (c) an electrical high voltage detecting circuit coupled in parallel with said neon circuit and having an internal ground establishing circuit located inside of said housing;
  (d) a tubular section for holding said test stick having an open end coupled to said housing at said open end, said open end containing the neon circuit whereby the neon circuit is inside said housing;
  (e) a spark gap on said housing opposite the tubular section and electrically coupled at one end to said neon and electrical circuits, said spark gap being selectively opened or closed to increase the electrical energy level delivered to said neon and electrical circuits to overcome the effect of radiated fields encountered under high voltage applications; and
  (f) an exterior electrical single wire terminal coupled to the other end of said spark gap for receiving electrical energy.

21. A test stick for detecting high voltage according to claim 20, further comprising:
  (a) a module containing said electrical high voltage detecting circuit;
  (b) a first compartment in said housing for holding the module; and
  (c) an end cap for said first compartment, said end cap being fastened to the housing to retain the module whereby the module is easily replaced.

22. A test stick for detecting high voltage according to claim 21 wherein said housing further comprises:
  (a) a second compartment adjoining said first compartment and receiving said tubular section, said second compartment being larger than the first compartment; and
  (b) a sight chamber located in said second compartment whereby the gas filled neon indicating tube can be observed.

23. A test stick for detecting high voltage according to claim 22 wherein said housing still further comprises:
  (a) a third compartment similar in size to said first compartment adjoining said second compartment and containing a power supply for the electrical high voltage detecting circuit; and
  (b) a second end cap for said third compartment, said second end cap being fastened to the housing to retain the power supply whereby the power supply is easily replaced.

24. A test stick for detecting high voltage according to claim 22 wherein said sight chamber is formed from a black, high gloss fiberglass material to enhance the visibility of the neon indicating tube.

25. A test stick for detecting high voltage according to claim 20 wherein said tubular member further comprises:
  a push button connector located at the end opposite said housing whereby additional tubular extensions can be attached.

26. A test stick for detecting high voltage according to claim 21, further comprising:
  (a) a light emitting diode fastened to said end cap;
  (b) a piezoelectric buzzer fastened to said end cap; and
  (c) a test switch fastened to said end cap wherein the light emitting diode, piezoelectric buzzer and test switch are easily accessible to a user.

27. A test stick according to claim 20 wherein said neon high voltage circuit further comprises:
  (a) a coil spring system forming a tube socket for said neon tube;
  (b) a conducting bolt coupling the terminal to one end of the coil spring system; and
  (c) an elongated capacitive member coupled to the other end of the coil spring system and located inside of said tubular section whereby the capacitive member allows operation of the neon circuit below 4 Kv.

* * * * *